United States Patent [19]

Barth

[11] Patent Number: 4,516,148
[45] Date of Patent: May 7, 1985

[54] SEMICONDUCTOR DEVICE HAVING IMPROVED LEAD ATTACHMENT

[75] Inventor: Phillip W. Barth, Palo Alto, Calif.

[73] Assignee: The Board of Trustees of the Leland Stanford, Jr. University, Stanford, Calif.

[21] Appl. No.: 412,942

[22] Filed: Aug. 30, 1982

[51] Int. Cl.³ .................. H01L 21/60; H01L 21/44
[52] U.S. Cl. ........................... 357/68; 357/26;
   357/55; 357/80; 357/65
[58] Field of Search ............. 357/68, 26, 55, 70, 357/80, 74

[56] References Cited

U.S. PATENT DOCUMENTS

| 3,231,797 | 1/1966 | Koch | 357/68 X |
|---|---|---|---|
| 3,614,678 | 10/1971 | Engeler et al. | 357/26 |
| 3,641,254 | 2/1972 | Bunting et al. | 357/70 X |
| 3,793,709 | 2/1974 | Baumann | 357/68 X |
| 4,127,863 | 11/1978 | Kurata | 357/65 |
| 4,286,374 | 12/1981 | Hantusch | 357/55 X |
| 4,353,082 | 10/1982 | Chatterjee | 357/55 X |
| 4,374,457 | 2/1983 | Weich, Jr. | 357/68 |
| 4,379,307 | 4/1983 | Soclof | 357/68 |

FOREIGN PATENT DOCUMENTS 7660  4/1969  Japan ..................................... 357/80

Primary Examiner—Andrew J. James
Assistant Examiner—S. V. Clark
Attorney, Agent, or Firm—Flehr, Hohbach, Test, Albritton & Herbert

[57] ABSTRACT

Improved contacts to a semiconductor device such as a plural substrate pressure sensor are provided by forming recessed contact regions along the periphery of a semiconductor substrate and interconnecting the contact regions with an internal circuit. A second, glass substrate encapsulates the circuit and covers the recessed contact regions thereby defining tunnels in the edges of the device. A pre-tinned wire can be inserted into a tunnel and solder bonded to a metal layer therein, thereby forming a single and rugged lead attachment.

7 Claims, 4 Drawing Figures

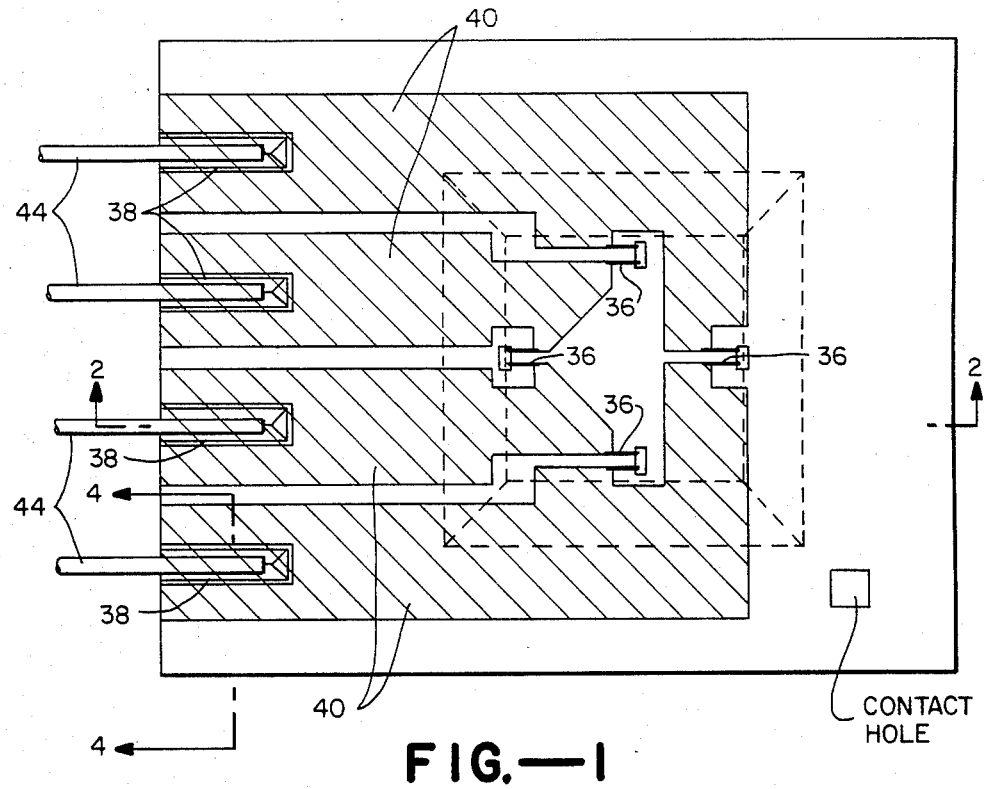
FIG.—1
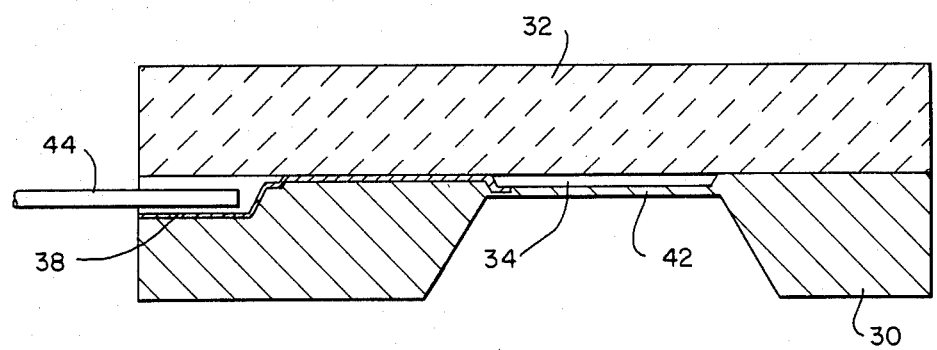
FIG.—2

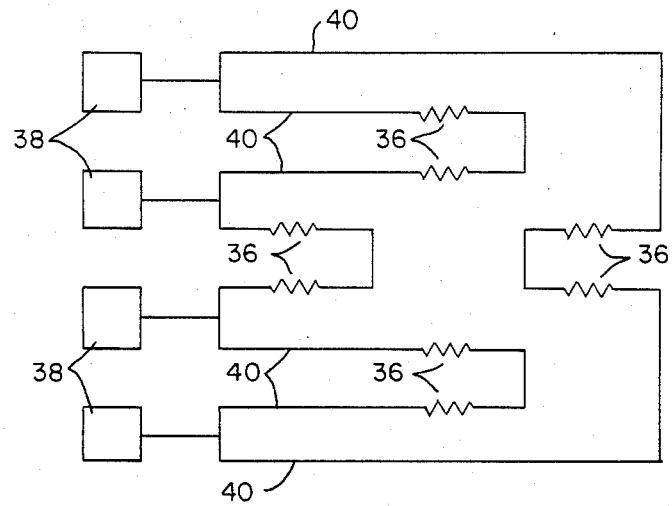
FIG.—3
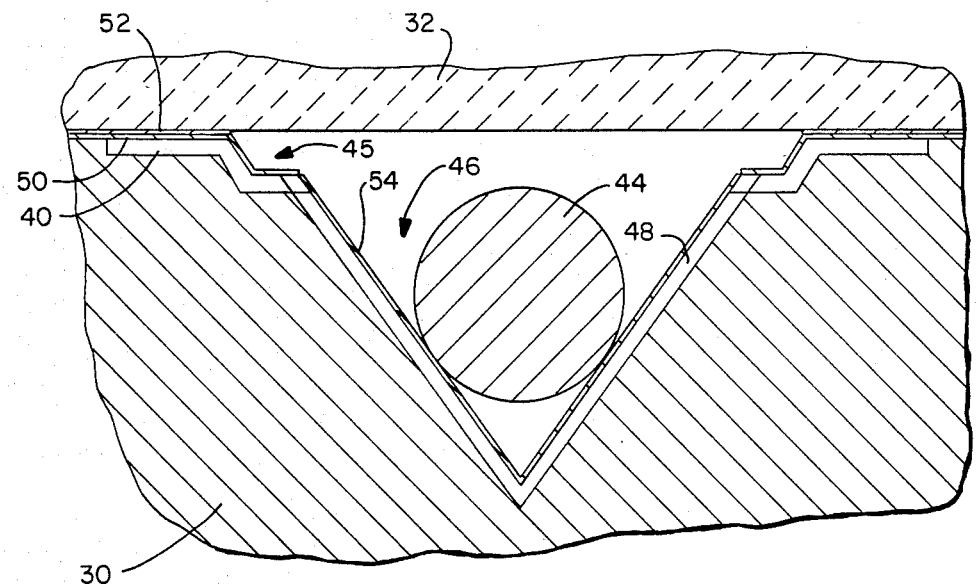
FIG.—4

SEMICONDUCTOR DEVICE HAVING IMPROVED LEAD ATTACHMENT

The U.S. Government has rights in this invention pursuant to Contract NIH-RR-01086 awarded by the National Institutes For Health.

This invention relates to semiconductor devices and more particularly the invention relates to novel lead attachments to semiconductor devices such as hermetically sealed electrical circuits and to a method of making such devices and the lead attachments thereto.

Sealed semiconductor devices are being utilized in a variety of applications and environments. The pressure transducer is one such device which is found in environments ranging from automotive to biomedical. One such sensor is described in copending application Ser. No. 297,430 filed Aug. 28, 1981 for "Hermetically Sealed Semiconductor Device and Method of Making Same".

The use of silicon to fabricate pressure sensors is known. Because of the piezoresistive characteristics of silicon resistors, the strain resulting from pressure stresses affects material resistance. Variations in current flowing through the voltage biased material can provide a measure of pressure on the material. Such sensors offer the advantage of being inexpensive and stable in operation.

However, the use of miniature silicon pressure sensors and other miniature semiconductor devices has been hampered in the past by the lack of a strong, simple method of attaching conductive leads to the devices. Previously, the attachment method for miniature sensors, and for silicon integrated circuits generally, have consisted of such methods as thermocompression bonding, welding, or the use of conductive epoxys; all of which lack either strength, simplicity, stability, or a combination of these features. The problems are especially evident in pressure sensors designed for biomedical use in-vivo which must be relatively cheap for clinical use as well as being small, strong, and corrosion resistant.

The present invention is directed to a novel lead attachment in which wires can be placed on a sensor by hand and held in place for solder attachment. In practicing the invention the only use of advanced equipment and techniques is included in the batch fabrication steps by which the entire sensor is fabricated. The attachment of leads can thus be performed easily using cheap and simple equipment, and the cost per sensor for bonding leads can be kept low. Further, the invention simplifies packaging requirements since the lead attachment points are mechanically strong.

Accordingly, an object of the invention is a semiconductor device in which lead attachment is readily facilitated.

Another object of the invention is the method of fabricating a semiconductor device having simplified lead attachments.

A feature of the invention is a tunnel structure in a side of a semiconductor device and in which a lead can be inserted and bonded.

In a preferred embodiment a semiconductor device such as a hermetically sealed pressure sensor is batch fabricated in a silicon wafer having a [100] surface which is susceptible to anisotropic etching. In fabricating the semiconductor circuit, edge portions of the circuit are anisotropically etched to form V grooves. The V grooves are doped and metallized to function as electrical contacts to the circuitry. The wafer is hermetically sealed by bonding a cover such as a Pyrex plate to the silicon wafer. The wafer is then cut by a saw to separate the individual devices with the V grooves functioning as tunnels for receiving external leads which can be readily soldered into place.

The invention and objects and features thereof will be more readily apparent from the following detailed description and appended claims when taken with the drawing, in which:

FIG. 1 is a top view of a semiconductor pressure sensor having contacts and lead attachment in accordance with the invention.

FIG. 2 is a section view of the sensor of FIG. 1 taken along the line 2—2.

FIG. 3 is an electrical schematic of the sensor of FIG. 1.

FIG. 4 is an enlarged section view of the device contact and lead attachment taken along the line 4—4 of FIG. 1.

Referring now to the drawings, FIG. 1 is a top view looking through a transparent glass cover of a silicon pressure transducer such as disclosed in copending application Ser. No. 297,430, supra, and having contact and lead attachments in accordance with one embodiment of the present invention. As shown in the section view of FIG. 2, the underlying silicon substrate 30 has a recessed region 34 which is hermetically sealed by the overlying glass 32, and a plurality of resistive elements shown generally at 36 are formed in the recessed region 34. Typically, the silicon substrate may be a lightly doped N-type material and the resistors 36 are P-type resistors formed in the recessed region 34 by conventional semiconductor processing techniques such as ion implantation or dopant diffusion. A thin diaphragm 42 is typically formed by subsequently etching the backside of the silicon substrate 30 after formation of the bond between the glass 32 and the substrate 30. The resistors 36 are connected to contacts 38 (to be described further hereinbelow) by means of conductive regions 40 formed in the substrate 30 by highly doping the regions 40 with a P-type dopant. External leads 44 make contact to the resistors 36 through the contacts 38 and region 40. FIG. 3 is an electrical schematic of the device.

In accordance with the invention the contacts 38 are provided in tunnels positioned along the edge of the semiconductor device for receiving the external leads 44. The contacts are suitably metallized whereby the leads can be solder bonded in place. The tunnels may be formed by anisotropically etching a surface of silicon. Anisotropic etching is the well known technique in semiconductor device fabrication in which a [100] crystallographic surface of silicon is etched by a basic aqueous mixture such as ethylenediamine/pyrocatechol/water. Alternatively, the tunnels can be formed by other techniques such as plasma etching or mechanically abrading the silicon surface prior to applying the glass cover.

FIG. 4 is a section view taken along the line 4—4 of FIG. 1 which shows the various layers and diffusions in forming the V groove contacts. The substrate 30 is lightly doped N type material and the conductive region 40 is a P+ doped region. The semiconductor surface is etched twice with a deep V groove 46 formed in the shallower V groove 45. The layer 48 of the V groove 46 is doped with a P+ dopant which contacts the conductive region 40. A silicon dioxide layer 50 overlies the conductive region 40 and a polycrystalline silicon layer 52 overlies the silicon oxide layer 50 for effecting an anodic bond with the Pyrex cover 32, as described in copending application Ser. No. 297,430, supra. A chrome-gold metal layer 54 is formed on the doped region 48 in the V groove, 46, and a pre-tinned wire 44 is inserted in the tunnel and soldered to the layer 54.

Fabrication of the contacts in accordance with the invention is readily compatible with conventional semiconductor fabrication processes. Near the end of the fabrication process for the sensor (which is batch fabricated on a silicon wafer), the V grooves are etched in the silicon wafer at the points where leads are to be attached. The grooves are then exposed to a dopant such as boron to create the heavily doped region 48 which ensures good low resistance contact. Next, the metal layer 54 is deposited on the wafer, and by photoresist masking and chemical etching the layer is removed from the wafer except in the V grooves. After the wafer is bonded to the glass cover, using an anodic bonding process such as that described in copending application Ser. No. 297,430, the finished devices are sawed apart and the saw cuts are made through the V groove areas near the edges of the grooves. Pre-tinned wires are inserted into the tunnels to make electrical contact with the metal in the grooves and thus with the sensor. The wires can be inserted for testing and subsequently removed, and good devices can have wires soldered permanently into the tunnels by heating the entire device to a temperature higher than the melting point of the solder but lower than the point at which damage to the chip can occur.

Following is a fabrication sequence for one embodiment of the described sensor including the steps in forming the V groove tunnel contacts. The fabrication sequence requires only one imprecise photolithagraphic step after the fabrication of the V grooves which can be accomplished using standard techniques. The use of a polycrystalline silicon field plate layer is a feature of one embodiment of the structure and is not an essential in the lead attachment method.

Starting material: Silicon, 200 micrometers thick +/−10 micrometers, polished on both sides, resistivity 1-5 Ohm-cm, [100] orientation.
Initial oxidation
Photolithography: Mask 1, for shallow etch.
Shallow etch for Hermetic Reference well and for areas around V-leads.
Long oxidation for backside oxide.
Protect backside. Strip all oxide from the frontside. Oxidation.
Photolithography: Mask 2, for first P-plus regions. Protect backside.
Diffusion predep: First P-plus regions, leads 40. Short Drive-in and oxide growth.
Protect backside. Strip all frontside oxide. This step is necessary to minimize step heights on the frontside for good hermetic sealing.
Diffusion Drive-in and oxidation.
Photolithography: Mask 3, for resistor regions. Protect backside.
Boron diffusion for resistors 36.
Resistor drive-in and oxide growth.
Photolithography: Mask 4; N-plus contact regions. Protect backside.
Diffusion predep: N-plus regions.
Diffusion Drive-in and oxide growth.
Photolithography: Repeat Mask 4; N-Plus contact holes. Protect backside.
Chemical vapor deposition (CVD): N-type polycrystalline silicon, phosphorous doped.
CVD: oxide pad over poly.
Photolithography: Mask 5, holes in polysilicon around V-leads. Protect backside.
CVD: Masking nitride
CVD: Oxide over nitride
Photolithography: Mask 6, deep V-groove regions.
Etch: Deep V-grooves (in ethylenediamine/pyrocatechol/water (EDPW).
Diffusion predep: Final P-plus contact regions in V-lead grooves.
Diffusion drive-in and oxide growth.
Strip nitride.
Oxide etch: Remove oxide from V-lead grooves and from poly surface in a timed etch.
Evaporation: chrome-gold.
Photolithography: Mask 7, metal pads.
Photolithography: Mask 8, backside well. Protect frontside. Glass-to-(poly)silicon bonding.
Etch: Backside well (in KOH/water or EDPW)
Saw: Expose tunnel mouths
Test: Insert leads into V-lead tunnels.
Bond: Use pre-tinned wires. Solder in place. Calibrate individual sensors.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A semiconductor device comprising a semiconductor substrate having an electrical circuit formed therein, a plurality of recessed regions formed in peripheral surface portions of said substrate, a second substrate affixed to said semiconductor substrate and overlying said recessed regions, said recessed regions and said second substrate defining tunnels for receiving electrical leads, contact means in said recessed regions and extending to said electrical circuit, a plurality of external electrical leads with end portions positioned in said recesses, and means for bonding said end portions to said contact means.

2. The semiconductor device as defined by claim 1 wherein said second substrate hermetically seals said electrical circuit and said device comprises a pressure sensor.

3. The semiconductor device as defined by claim 1, or 2 wherein said semiconductor substrate comprises monocyrstalline silicon having a [100] surface and said recessed regions are V grooves formed by anisotropic etch of said [100] surface.

4. The semiconductor device as defined by claim 1 wherein said contact means includes a doped layer in said recessed regions and metal layers on the surfaces of said recessed regions.

5. The semiconductor device as defined by claim 4 wherein said metal layer comprises chrome-gold, said electrical leads comprise pre-tinned wires, and said means for bonding said leads to said metal layers comprises solder.

6. A semiconductor pressure transducer comprising a monocyrstalline silicon substrate having first and second major surfaces with [100] crystalline orientation, a first recessed region in a first major surface, an electrical circuit formed in said first recessed region, a second recessed region in said second major surface thereby defining a diaphragm between said first recessed region and said second recessed region, a glass cover bonded to said first major surface and hermetically sealing said electrical circuit, a plurality of recessed contact regions formed in peripheral portions of said first major surface, said recessed contact regions and said glass cover defining tunnels for receiving external wire leads, and conductive regions formed in said first major surface and interconnecting said resistive circuit and said plurality of recessed contact regions.

7. The semiconductor pressure transducer as defined by claim 6 wherein said recessed contact regions include metal layers formed on the surfaces thereof for solder bonding external leads to said recessed contact regions.

* * * * *